United States Patent
Murata et al.

(10) Patent No.: US 7,935,542 B2
(45) Date of Patent: May 3, 2011

(54) MANUFACTURING METHOD OF SEMICONDUCTOR DEVICE HAVING MEMORY ELEMENT WITH PROTECTIVE FILM

(75) Inventors: Tatsunori Murata, Tokyo (JP); Mikio Tsujiuchi, Tokyo (JP); Ryoji Matsuda, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 61 days.

(21) Appl. No.: 12/411,665

(22) Filed: Mar. 26, 2009

(65) Prior Publication Data

US 2009/0269860 A1    Oct. 29, 2009

(30) Foreign Application Priority Data

Apr. 23, 2008  (JP) ................. 2008-112548

(51) Int. Cl.
*H01L 21/00* (2006.01)
(52) U.S. Cl. .................... 438/3; 257/E21.665
(58) Field of Classification Search ...... 438/3; 257/E21.665
See application file for complete search history.

(56) References Cited

U.S. PATENT DOCUMENTS

| 5,508,067 A | * | 4/1996 | Sato et al. | 427/579 |
| 2004/0180529 A1 | * | 9/2004 | Fukuhara et al. | 438/622 |
| 2005/0280040 A1 | * | 12/2005 | Kasko et al. | 257/213 |

FOREIGN PATENT DOCUMENTS

JP    2007-305645    11/2007

* cited by examiner

*Primary Examiner* — W. David Coleman
(74) *Attorney, Agent, or Firm* — McDermott Will & Emery LLP

(57) ABSTRACT

To provide a manufacturing method of a semiconductor device capable of forming, as a protective film of an MTJ element, a silicon nitride film having good insulation properties without deteriorating the properties of the MTJ element. The method of the invention includes steps of forming a silicon nitride film over the entire surface including an MTJ element portion (MTJ element and an upper electrode) while using a parallel plate plasma CVD apparatus as a film forming apparatus and a film forming gas not containing $NH_3$ but composed of $SiH_4/N_2$/helium (He). The film forming temperature is set at from 200 to 350° C. More ideally, a flow rate ratio of He to $SiH_4$ is set at from 100 to 125.

8 Claims, 17 Drawing Sheets

MANUFACTURING METHOD OF SEMICONDUCTOR DEVICE HAVING MEMORY ELEMENT WITH PROTECTIVE FILM

CROSS-REFERENCE TO RELATED APPLICATIONS

The disclosure of Japanese Patent Application No. 2008-112548 filed on Apr. 23, 2008 including the specification, drawings and abstract is incorporated herein by reference in its entirety.

BACKGROUND OF THE INVENTION

The present invention relates to a manufacturing method of a semiconductor device having a memory element such as MTJ (Magnetic Tunnel Junction) element.

MRAM is a memory using a magnetic material as a memory element and storing data, depending on the magnetization direction of the magnetic material. In other words, it is a memory storing data in the spin of electrons, thereby holding the data and it has a randomly accessible circuit. The memory element to be utilized as MRAM is, for example, an MTJ element. The term "MTJ element" in this specification is used as a concept including a TMR (Tunneling Magneto Resistance) element.

A method of forming a silicon nitride film (plasma SiN film) as a protective film for covering a memory element of MRAM therewith has conventionally been employed. It is the common practice to form this silicon nitride film by a CVD method with an ammonia gas ($NH_3$), a silane gas ($SiH_4$), and a nitrogen gas ($N_2$) as a film forming gas. Such a silicon nitride film formation method is disclosed in Japanese Unexamined Patent Publication No. 2007-305645.

SUMMARY OF THE INVENTION

It is however empirically known that use of $NH_3$ as a film forming gas deteriorates the properties of the MTJ element.

A silicon nitride film formed by the CVD method by using $SiH_4$ and $N_2$ without using $NH_3$ as a film forming gas however does not have good insulation properties.

The invention has been made to overcome the above-described problems. An object of the invention is to provide a manufacturing method of a semiconductor device capable of forming, as a protective film of an MTJ element, a silicon nitride film having good insulation properties without deteriorating the properties of the MTJ element.

In one aspect of the invention, a silicon nitride film is formed while covering therewith at least a surface and a side surface of an MTJ element portion. The silicon nitride film is formed by a CVD method under a condition using a film forming gas containing a hydrogen gas or a helium gas and not containing an ammonia gas (for example, containing three gases, that is, $SiH_4$, $NH_3$, and $N_2$). A film formation temperature is set within a range of from 200 to 350° C.

In this mode, a silicon nitride film is formed without using $NH_3$ as a film forming gas so that formation of the silicon nitride film has no adverse effect on the properties of the MTJ element.

Moreover, the manufacturing method according to this mode is effective for forming a silicon nitride film having good insulation properties by using He or $H_2$ instead of $NH_3$ as a film forming gas.

DETAILED DESCRIPTION OF THE PREFERRED EMBODIMENTS

Principle of Invention

A silicon nitride film to be used in a general metallization process is formed at a film forming temperature around 400° C. with a parallel plate plasma CVD apparatus. Upon preparation of this film, three gases, that is, $SiH_4$, $NH_3$, and $N_2$ are employed as a film forming gas.

It is however empirically known that formation of a silicon nitride film as a protective film of an MTJ element under the above-described film forming conditions deteriorates the magnetic properties of the MTJ element. The deterioration of magnetic properties is presumed to occur by an adverse effect resulting from nitridation of a magnetic film with an $NH_x$ radical.

Moreover, a reaction between the $NH_x$ radical and the magnetic material of the magnetic film of the MTJ element is presumed to deteriorate the magnetic properties of the magnetic film. In particular, when the magnetic film has, as a constituent material thereof, a ferromagnetic material such as cobalt iron boron (CoFeB) alloy or a boron (B) containing substance, the $NH_x$ radical causes diffusion of B and as a result, having an adverse effect on the magnetic film.

When a silicon nitride film is formed as a protective film of an MTJ element, a first condition is that $NH_3$ is not used as a film forming gas.

When a silicon nitride film is formed while suppressing deterioration of the properties of the MTJ element, a second condition is that the silicon nitride film is formed at a film forming temperature of from 200° C. to 350° C.

The invention therefore resides in a manufacturing method of a silicon nitride film having good insulation properties as a protective film of an MTJ element under the above-described first or second condition. The second condition will be described later in detail.

Embodiment 1

Figure 1:
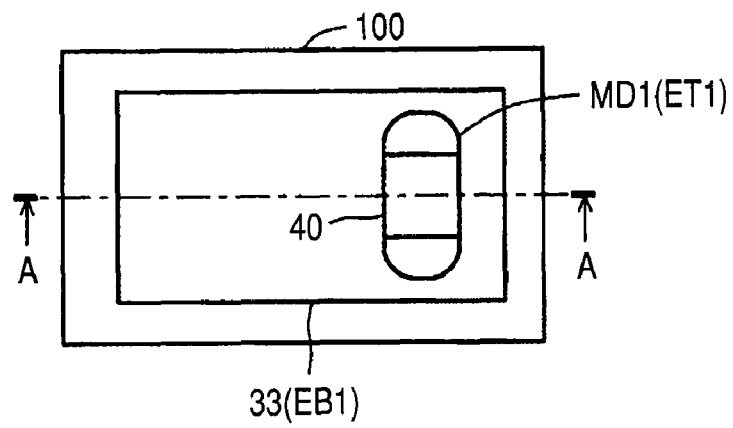
FIG. 1 is a plan view illustrating the planar structure of an MTJ element portion of an MRAM according to Embodiment 1 of the invention.

FIG. 1 is a plan view illustrating a planar structure of a memory cell portion (memory cell formation region) of MRAM according to Embodiment 1 of the invention. As illustrated in this drawing, a lower electrode EB1 having, as a planar shape thereof, a horizontally-long rectangular shape is formed over a semiconductor substrate 100 and an MTJ element MD1 (upper electrode ET1) having, as a planar shape thereof, a vertically-long elliptical shape is formed on the right side of the lower electrode EB1. In addition, a silicon nitride film 33 having, as a planar shape thereof, a horizontally long rectangular shape similar to that of the lower electrode EB1 is formed to cover the upper portion of the MTJ element MD1. At the center of the MTJ element MD1, a via-hole 40 is arranged.

FIGS. 2 to 21 are cross-sectional views illustrating a manufacturing method of the memory cell portion of the MRAM of Embodiment 1. FIGS. 2 to 21 correspond to the cross-section taken along a line A-A of FIG. 1. Referring to FIGS. 2 to 21, the manufacturing method of the MRAM of Embodiment 1 will next be described.

Figure 2:
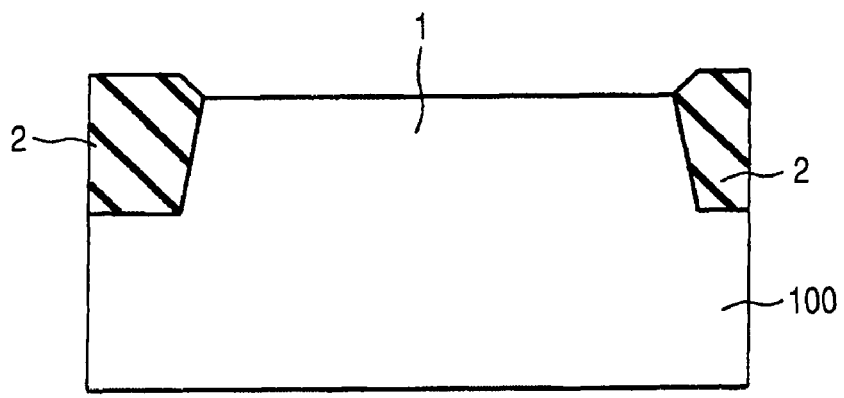
FIG. 2 is a cross-sectional view illustrating a manufacturing method of the memory configuration of the MRAM according to Embodiment 1.

First, as illustrated in FIG. 2, an element isolation region 2 is formed selectively in the upper layer portion of a semiconductor substrate 100. The upper portion of the semiconductor substrate 100 between the element isolation regions 2 and 2 becomes an active region 1 in which a transistor or the like are to be formed.

Figure 3:
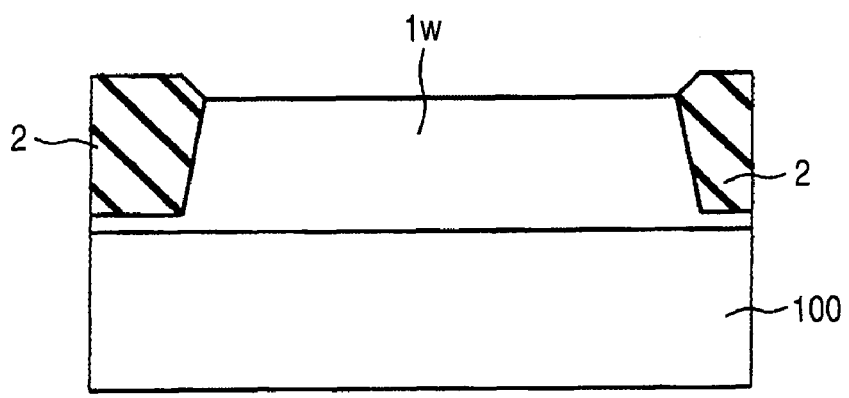
FIG. 3 is a cross-sectional view illustrating a manufacturing method of Embodiment 1.

As illustrated in FIG. 3, a first conductivity type impurity is introduced to form a well region 1w in the upper layer portion of the semiconductor substrate 100.

Figure 4:
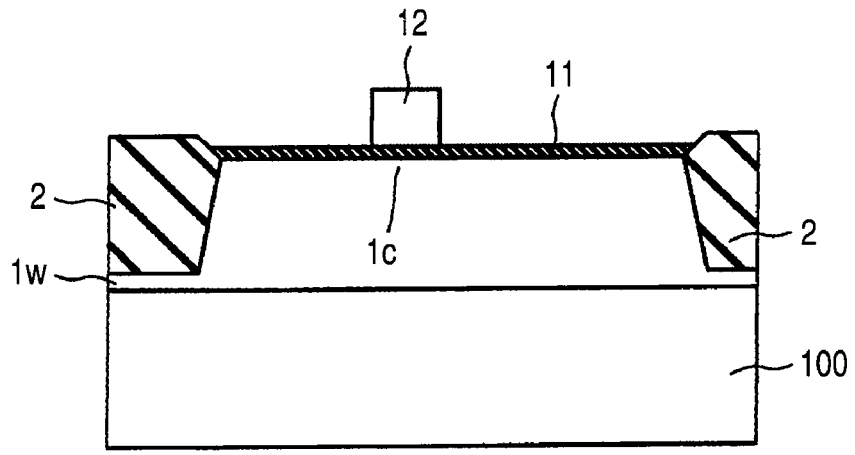
FIG. 4 is a cross-sectional view illustrating a manufacturing method of Embodiment 1.

As illustrated in FIG. 4, a gate insulating film 11 is formed over the well region 1w and a gate electrode 12 is formed selectively over the gate insulating film 11. The surface of the well region 1w below the gate electrode 12 is defined as a channel region 1c.

Figure 5:
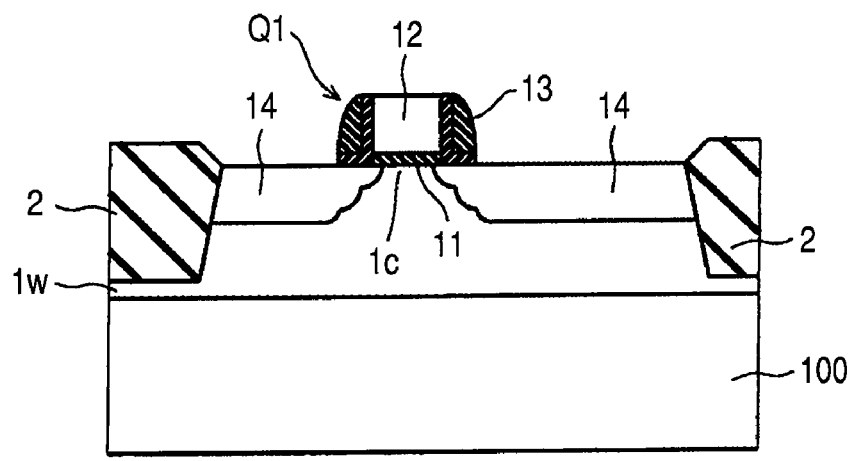
FIG. 5 is a cross-sectional view illustrating a manufacturing method of Embodiment 1.

Then, as illustrated in FIG. 5, after implantation and then diffusion of an impurity having a second conductivity type (conductivity type opposite to the first conductivity type) in self alignment with the gate electrode 12, a side wall 13 having a two-layer structure is formed over the side surface of the gate electrode 12. A second-conductivity type impurity is then implanted and diffused in self alignment with the gate electrode 12 and the side wall 13 to form a pair of source/drain regions 14 and 14 having an extension region in the vicinity of the channel region 1c. As a result, an MOS transistor Q1 having the channel region 1c, the gate insulating film 11, the gate electrode 12, and the source/drain region 14 is formed.

Figure 6:
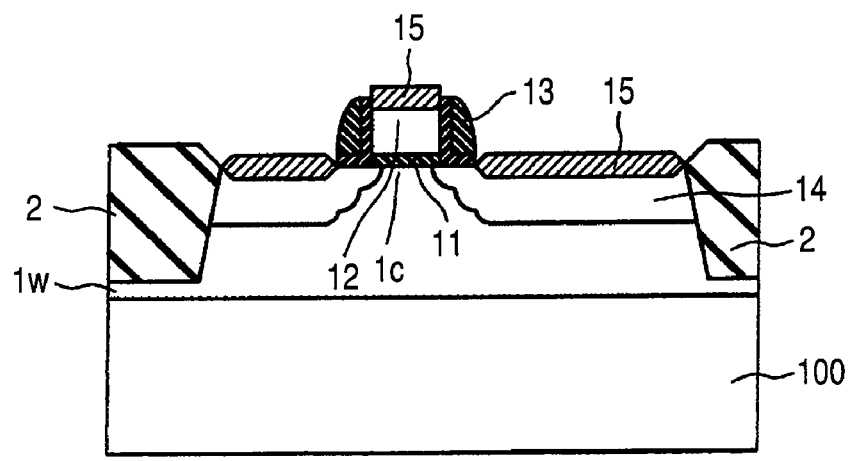
FIG. 6 is a cross-sectional view illustrating a manufacturing method of Embodiment 1.

As illustrated in FIG. 6, a cobalt silicide region 15 is then formed over the respective surfaces of the source/drain regions 14 and 14, and the gate electrode 12.

Figure 7:
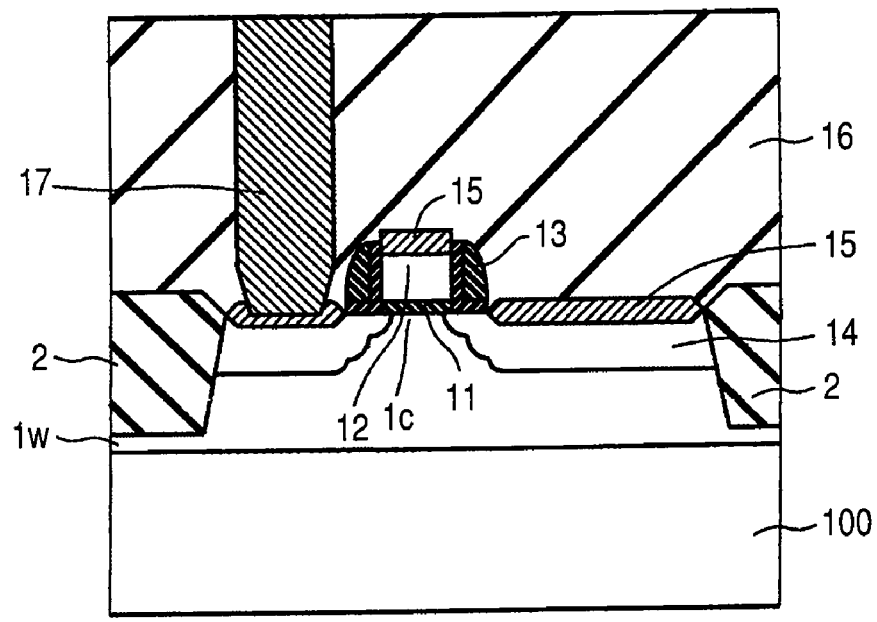
FIG. 7 is a cross-sectional view illustrating a manufacturing method of Embodiment 1.

As illustrated in FIG. 7, an interlayer insulating film 16 is then formed over the entire surface and a contact plug 17 penetrating through the interlayer insulating film 16 is selectively formed. The contact plug 17 is electrically coupled to the cobalt silicide region 15 over one of the source/drain regions 14 and 14.

Figure 8:
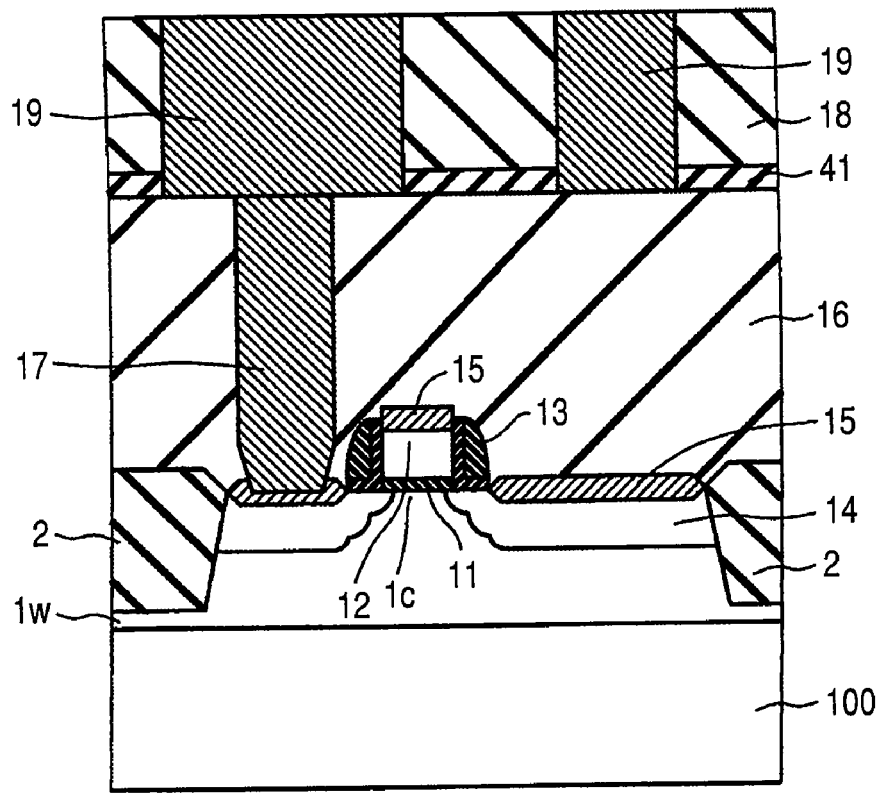
FIG. 8 is a cross-sectional view illustrating a manufacturing method of Embodiment 1.

As illustrated in FIG. 8, a nitride film 41 and an interlayer insulating film 18 (which is an oxide film) are then stacked over the entire surface and Cu interconnects 19 penetrating through the nitride film 41 and the interlayer insulating film 18 are selectively formed. As a result, some of the Cu interconnects 19 are electrically coupled to the contact plug 17. In such a manner, the Cu interconnects 19 are formed as a first-level metal interconnect.

Figure 9:
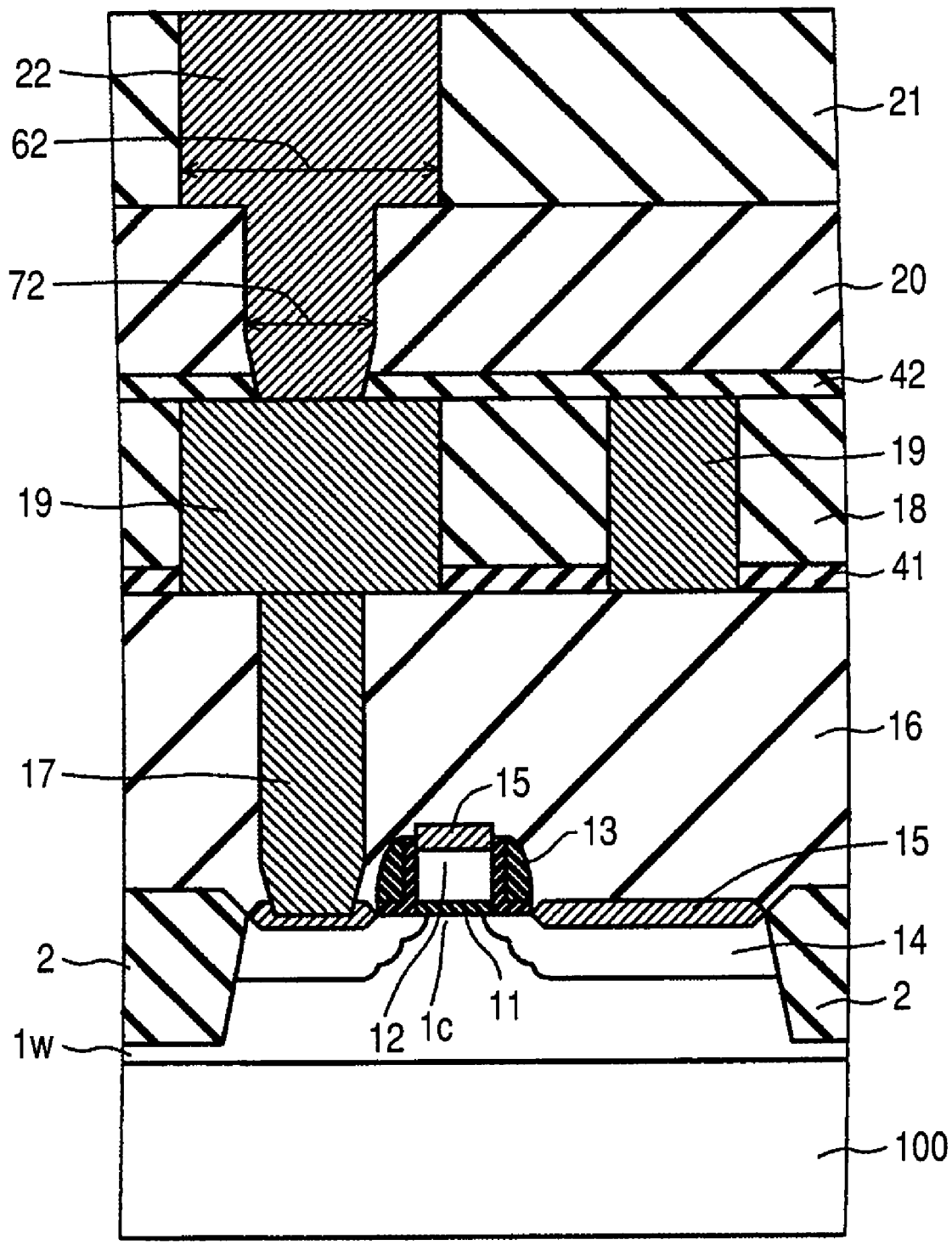
FIG. 9 is a cross-sectional view illustrating a manufacturing method of Embodiment 1.

As illustrated in FIG. 9, a nitride film 42 and interlayer insulating films 20 and 21 (which are oxide films) are stacked over the entire surface and a minute hole 72 penetrating through the nitride film 42 and the interlayer insulating film 20 is selectively formed. In addition, an interconnect hole 62 penetrating through the interlayer insulating film 21 is selectively formed over a region including the minute hole 72. A Cu interconnect 62 is formed while filling therewith the minute hole 72 and the interconnect hole 62. The Cu interconnect 22 is electrically coupled to the Cu interconnect 19 (the Cu interconnect 19 electrically coupled to the contact plug 17). In such a manner, the Cu interconnect 22 is formed as a second-level metal interconnect by using the damascene technology.

Figure 10:
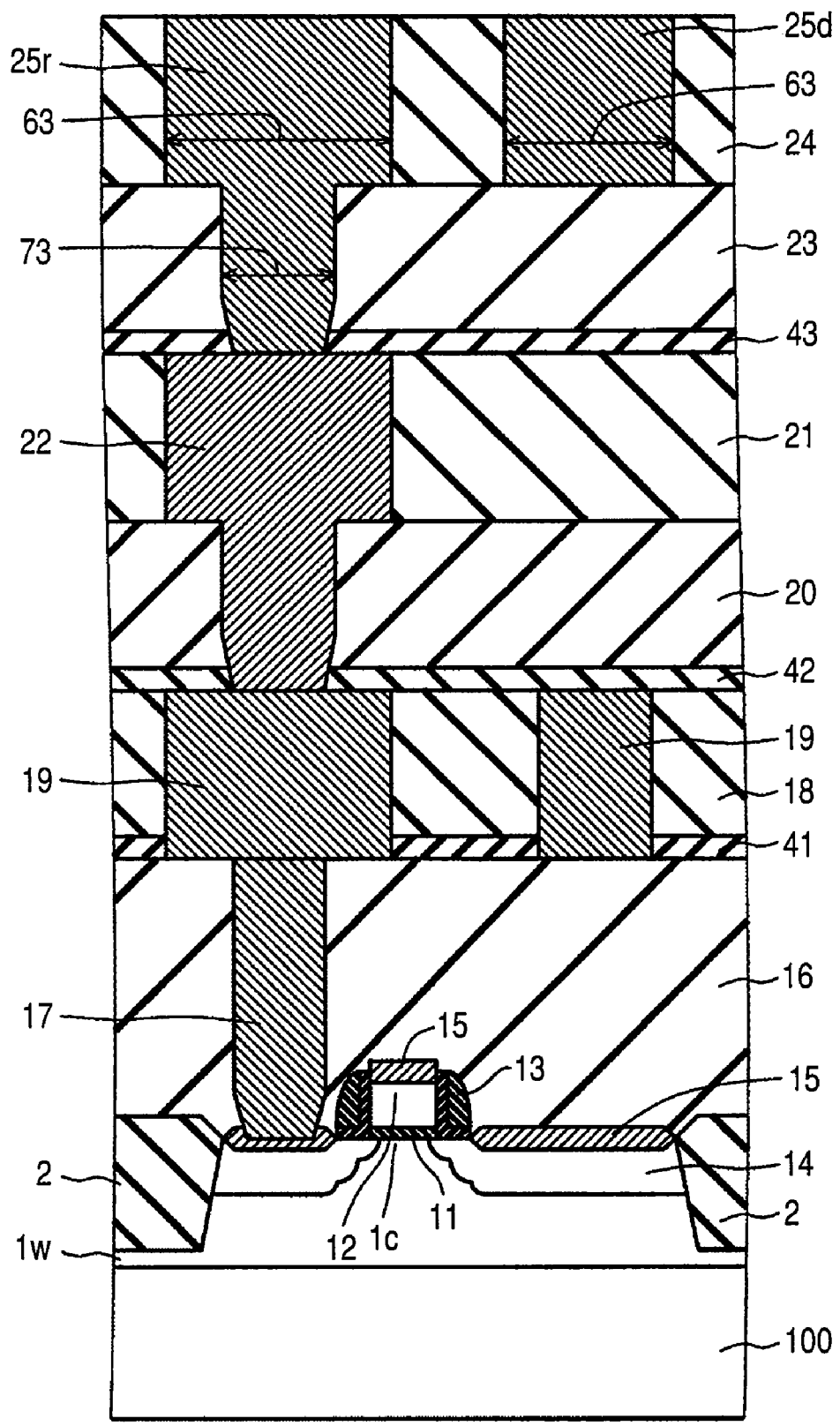
FIG. 10 is a cross-sectional view illustrating a manufacturing method of Embodiment 1.

As illustrated in FIG. 10, a nitride film 42 and interlayer insulating films 23 and 24 (each, made of an oxide film) are then formed over the entire surface. A minute hole 73 penetrating through the nitride film 43 and the interlayer insulating film 23 is selectively formed. In addition, an interconnect hole 63 penetrating through the interlayer insulating film 24 over a region including the minute hole 73 is selectively formed. Cu interconnects 25 (a lead line 25r and a digit line 25d (word line)) are formed while filling therewith the minute hole 73 and the interconnect hole 63. The lead line 25r is electrically coupled to the Cu interconnect 22. In such a manner, the Cu interconnects 25 are formed as a third-level metal interconnect by using the damascene technology.

Figure 11:
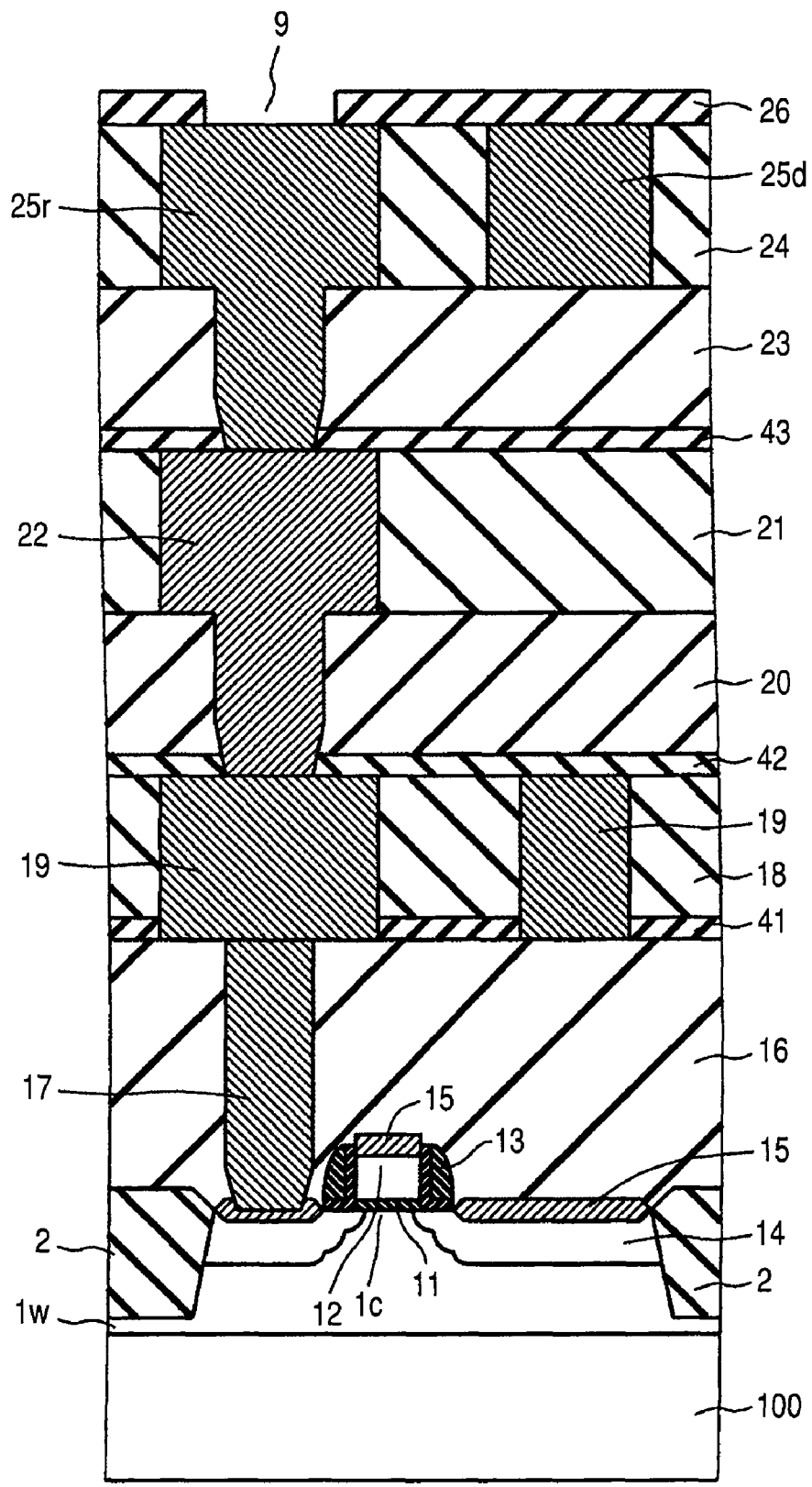
FIG. 11 is a cross-sectional view illustrating a manufacturing method of Embodiment 1.

As illustrated in FIG. 11, an interlayer insulating film 26 which is a silicon nitride film is formed over the entire surface and a via hole 9 penetrating through a portion of the interlayer insulating film over a region of the lead line 25r in the memory cell portion is selectively formed.

Figure 12:
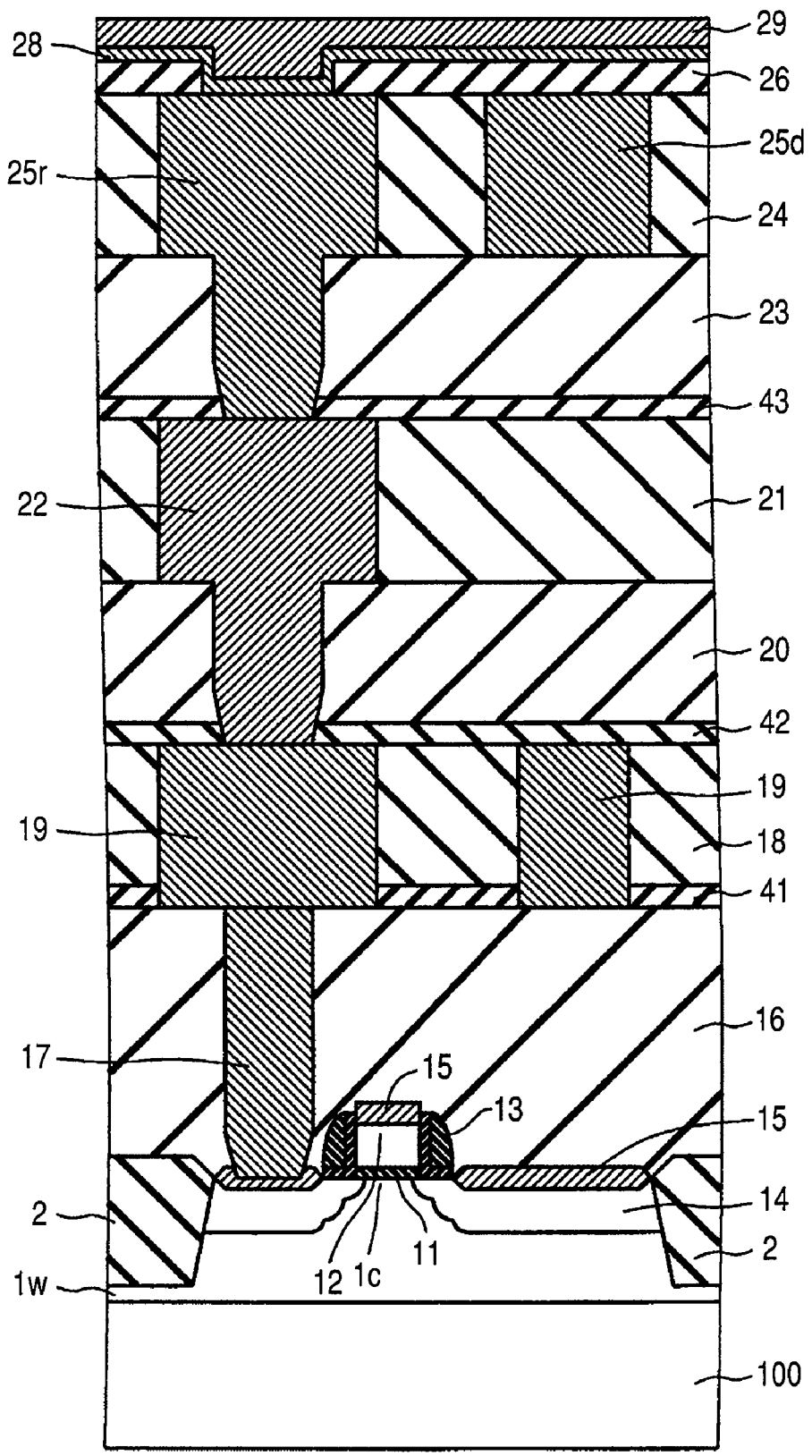
FIG. 12 is a cross-sectional view illustrating a manufacturing method of Embodiment 1.

As illustrated in FIG. 12, a barrier metal layer 28 is then formed over the entire surface including the inside of the via hole 9 and a via-filling metal layer 29 is formed over the barrier metal layer 28.

Figure 13:
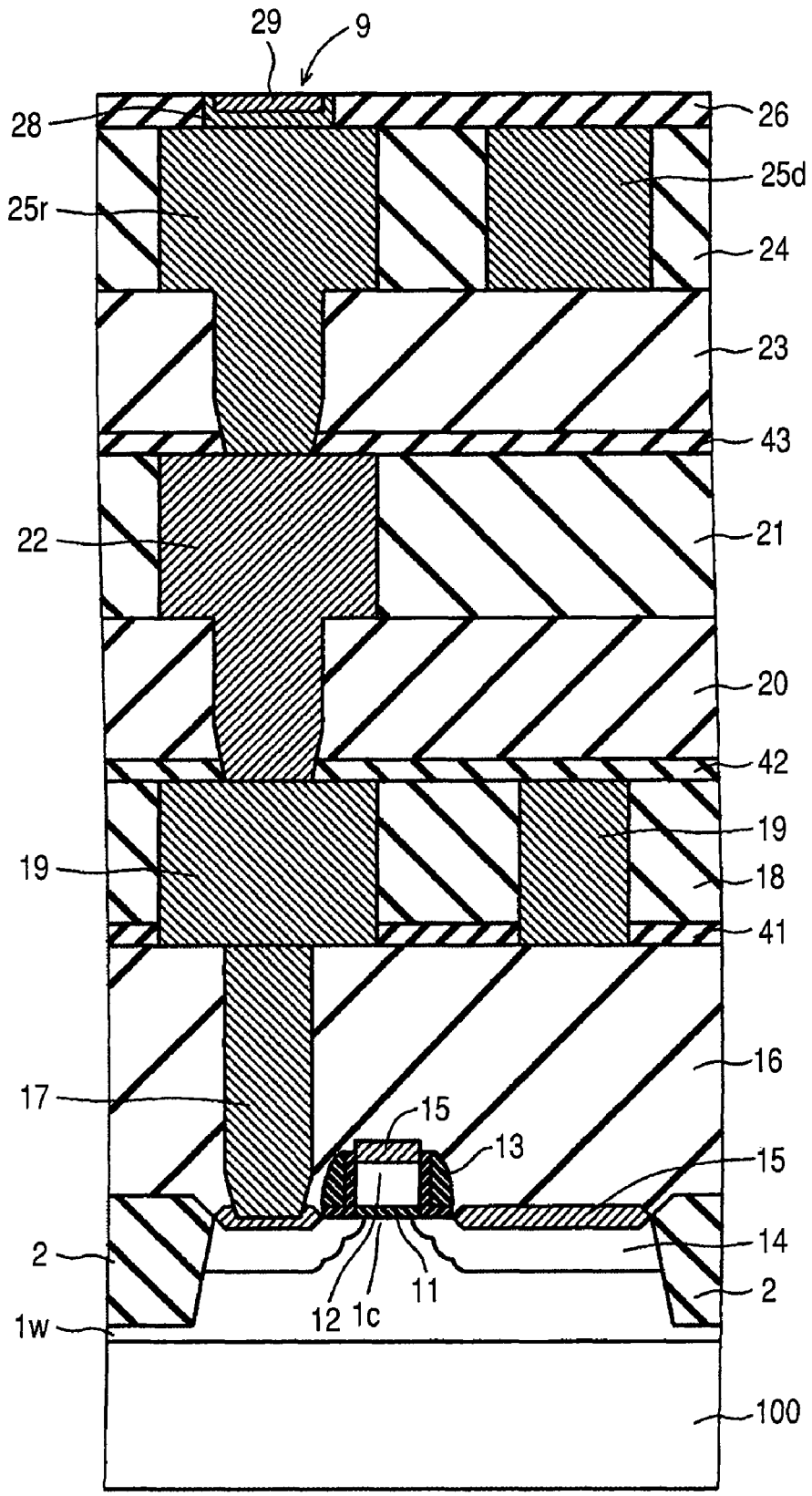
FIG. 13 is a cross-sectional view illustrating a manufacturing method of Embodiment 1.

As illustrated in FIG. 13, the barrier metal layer 28 and the via filling metal layer 29 are subjected to CMP treatment to leave only the barrier metal layer 28 and the via filling metal layer 29 in the via hole 9.

Figure 14:
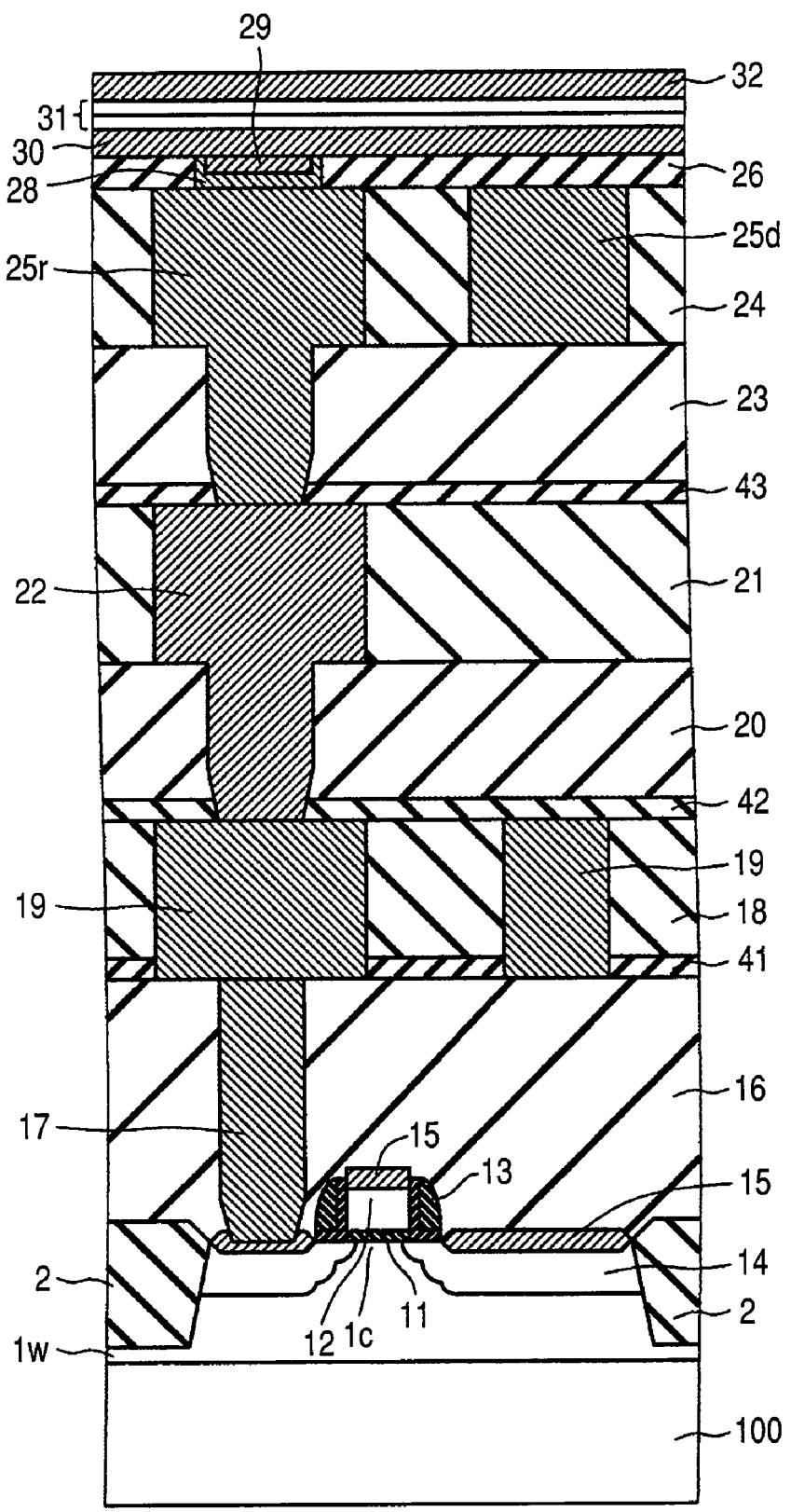
FIG. 14 is a cross-sectional view illustrating a manufacturing method of Embodiment 1.

As illustrated in FIG. 14, a lower electrode layer 30, a film 31 for MTJ, and an upper electrode layer 32 are then stacked one after another over the entire surface. The lower electrode layer 30 and the upper electrode layer 32 are formed using, for example, Ta as a constituent material and they are formed, for example, by sputtering.

Figure 15:
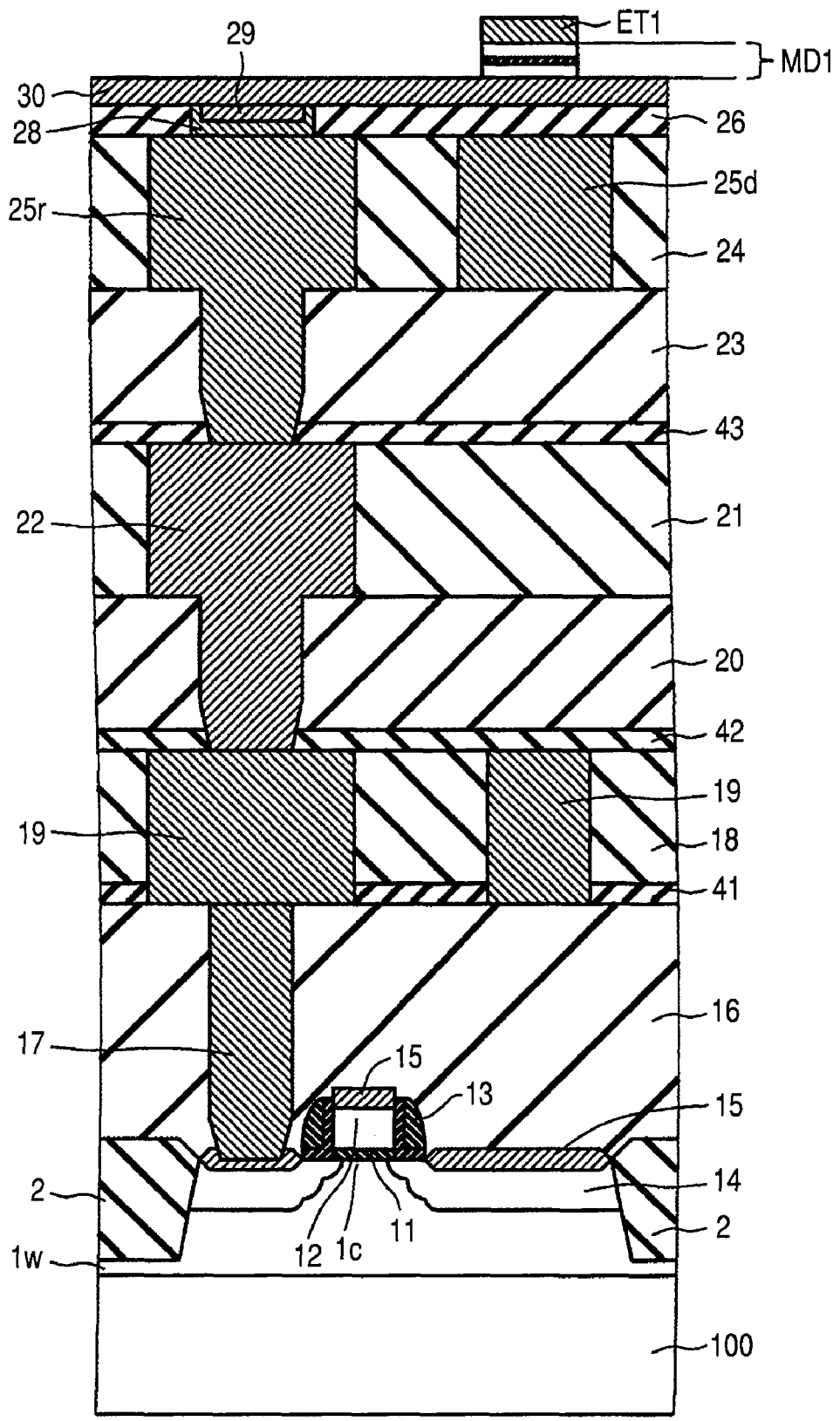
FIG. 15 is a cross-sectional view illustrating a manufacturing method of Embodiment 1.

As illustrated in FIG. 15, the film 31 for MTJ and the upper electrode layer 32 are then patterned with a patterned resist which is not illustrated in FIG. 15 to obtain an MTJ element MD1 and an upper electrode ET1. These MTJ element MD1 and upper electrode ET1 form an MTJ element portion.

Figure 16:
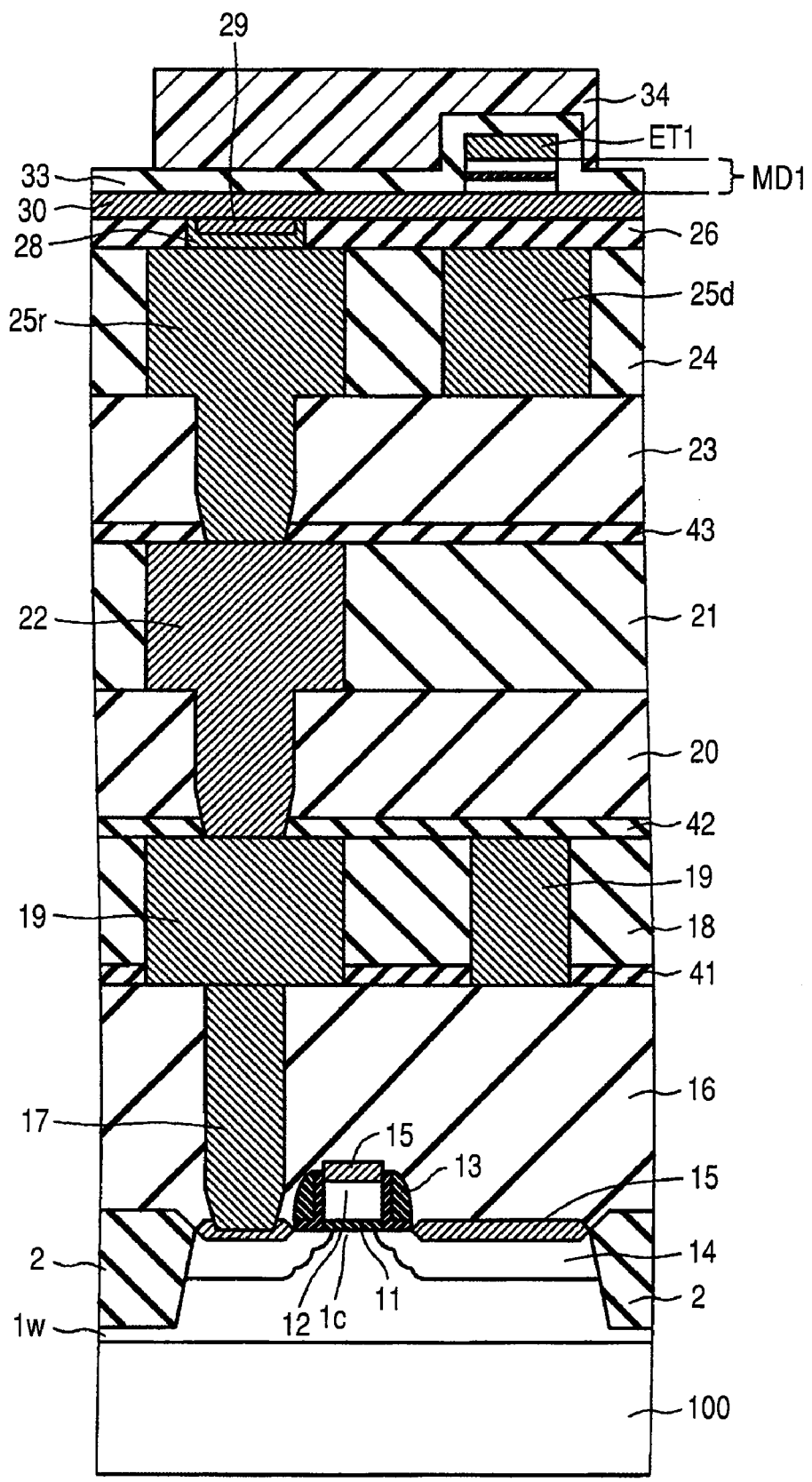
FIG. 16 is a cross-sectional view illustrating a manufacturing method of Embodiment 1.

As illustrated in FIG. 16, a silicon nitride film 33 is then formed over the entire surface including the MTJ element portion (the MTJ element MD1 and the upper electrode ET1). The silicon nitride film 33 is formed at a temperature (for example, temperature not higher than about 300° C.) low enough to have no effect on the electrical and magnetic properties of a magnetic material forming the MTJ element MD1 in order to satisfy the above-mentioned second condition. As a result, the silicon nitride film 33 is formed directly on the surface and the side surface of the MTJ element MD1. A resist pattern 34 is then formed selectively over the silicon nitride film 33 by lithography.

Figure 17:
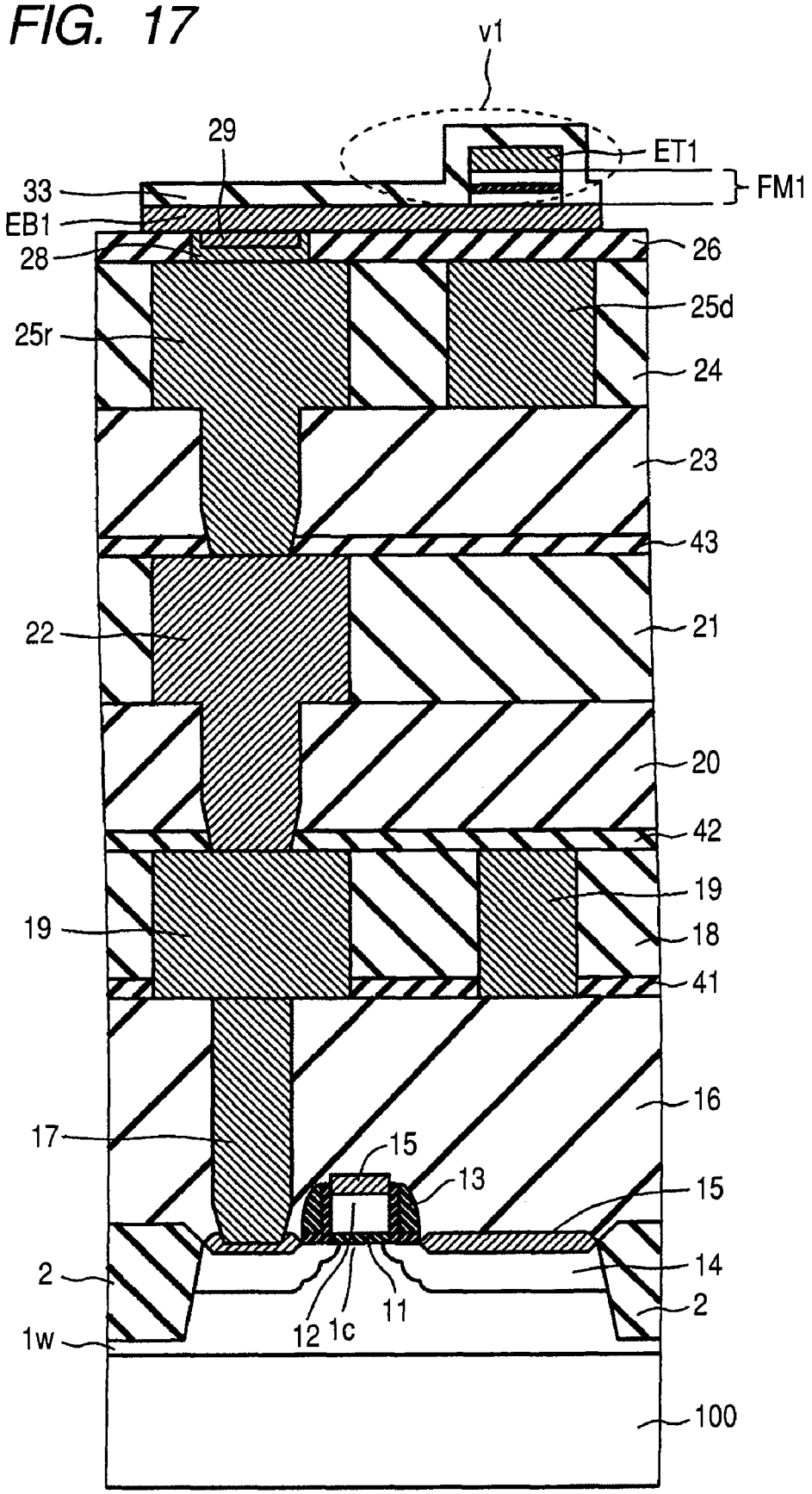
FIG. 17 is a cross-sectional view illustrating a manufacturing method of Embodiment 1.

As illustrated in FIG. 17, the silicon nitride film 33 and the lower electrode layer 30 are patterned by dry etching with the resist pattern 34 as a mask to obtain patterned silicon nitride film 33 and lower electrode EB1.

Since the silicon nitride film 33 and the lower electrode layer 30 are patterned simultaneously, the surface and the side surface of the MTJ element MD1 are protected with the silicon nitride film 33 during patterning of the lower electrode layer 30. As a result, generation of a leakage current of the MTJ element MD1 induced by the residue of the lower electrode layer 30 attached onto the side surface of the MTJ element 1 can be prevented effectively.

Figure 18:
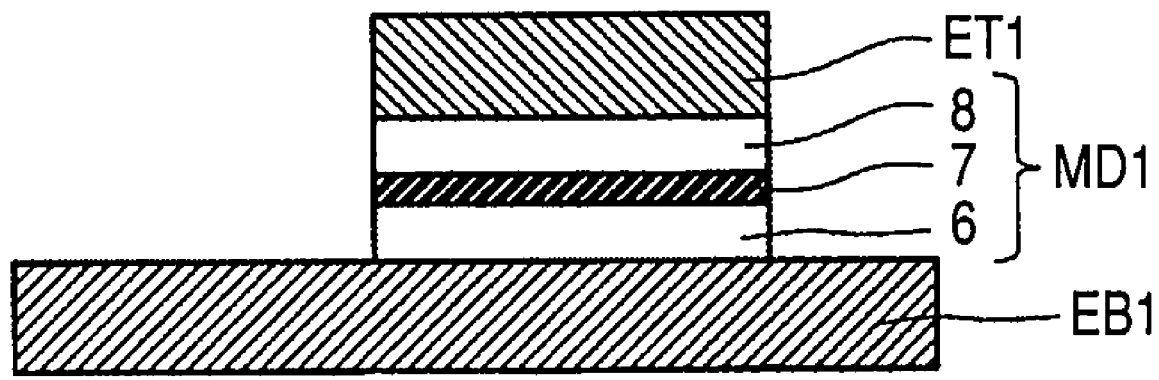
FIG. 18 is a cross-sectional view illustrating a manufacturing method of Embodiment 1.

FIG. 18 is an explanatory view illustrating an enlarged structure of a region v1 enclosed with a broken line in FIG. 17. From FIG. 18, the silicon nitride film 33 is omitted. As illustrated in this drawing, the MTJ element portion having the MTJ element MD1 and the upper electrode ET1 over the lower electrode EB1 can be obtained. Described specifically, the MTJ element MD1 has a stack structure of a lower magnetic film 6 (pin layer), a tunnel insulating film 7, and an upper magnetic film 8 (free layer).

Figure 19:
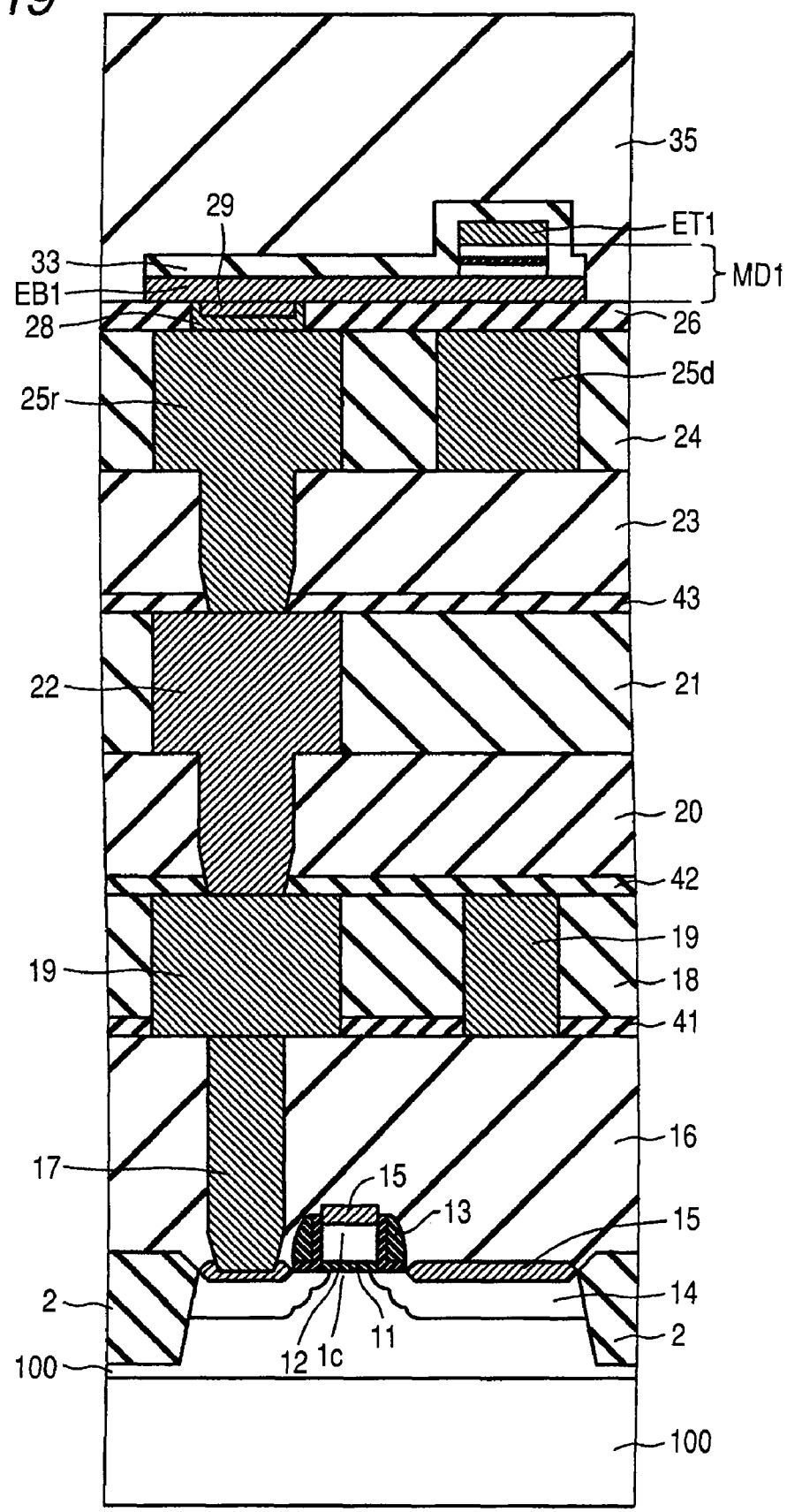
FIG. 19 is a cross-sectional view illustrating a manufacturing method of Embodiment 1.

As illustrated in FIG. 19, an interlayer insulating film 35 made of $SiO_2$ is formed over the entire surface. Even if hydrogen or water is diffused from the interlayer insulating film 35 during formation, the presence of the silicon nitride film 33 protects the MTJ element MD1 from a magnetic damage.

Figure 20:
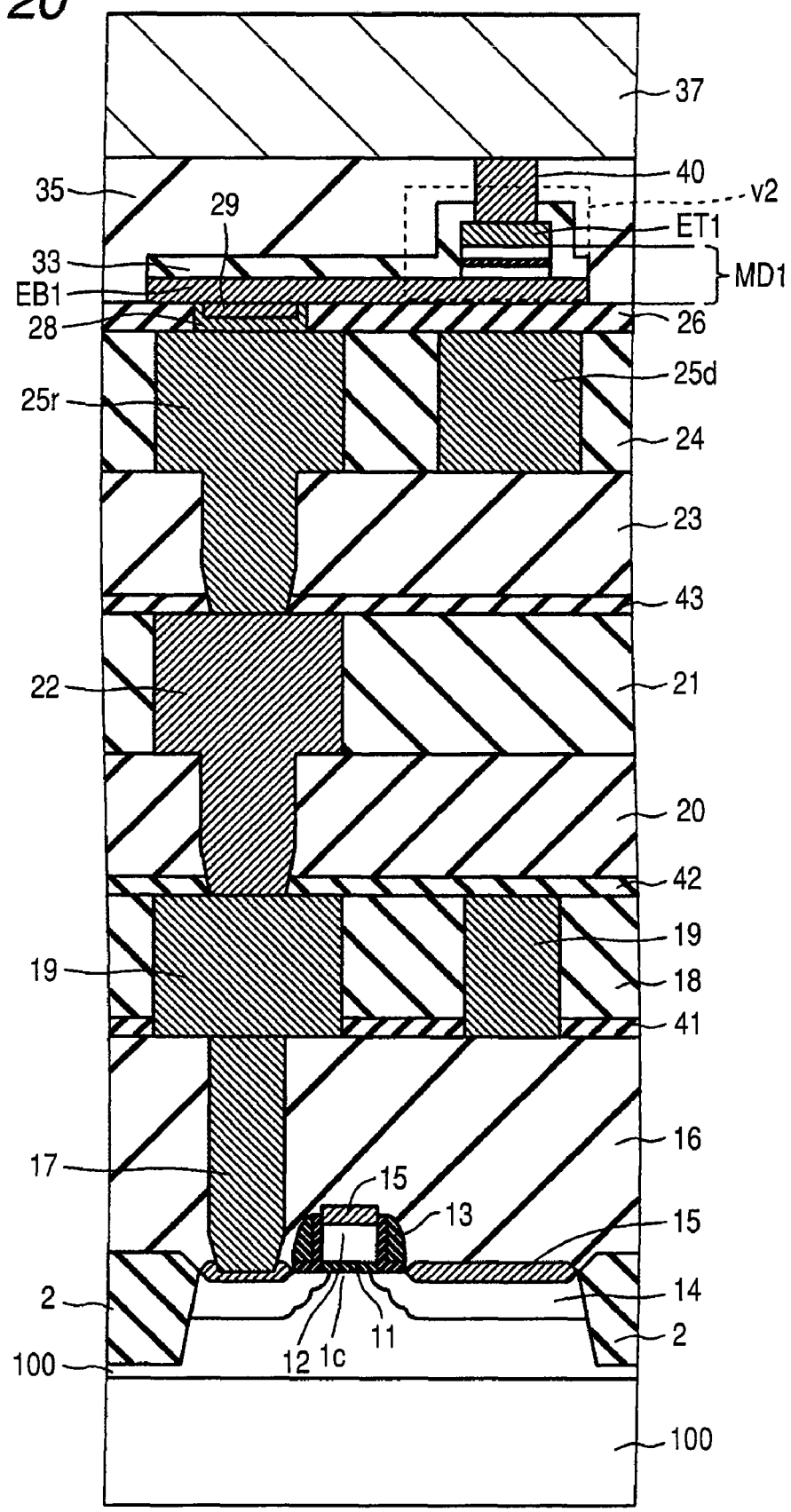
FIG. 20 is a cross-sectional view illustrating a manufacturing method of Embodiment 1.

As illustrated in FIG. 20, the interlayer insulating film 35 is subjected to CMP treatment to planarize the interlayer insulating film 35. Then, a via hole 40 (first through-hole) penetrating through the silicon nitride film 33 and the interlayer insulating film 35 is formed selectively above the upper electrode ET1. The silicon nitride film 33 functions as a stopper film during formation of the via hole 40 through the interlayer insulating film 35.

Next, a bit line is obtained by forming a Cu interconnect 37 over the interlayer insulating film 35, while filling the via hole 40 with the Cu interconnect 37. As a result, the Cu interconnect 37 is electrically coupled to the upper electrode ET1 of the MTJ element MD1 via the via hole 40. In such a manner, the Cu interconnect 37 is formed as a fourth-level metal interconnect.

Figure 21:
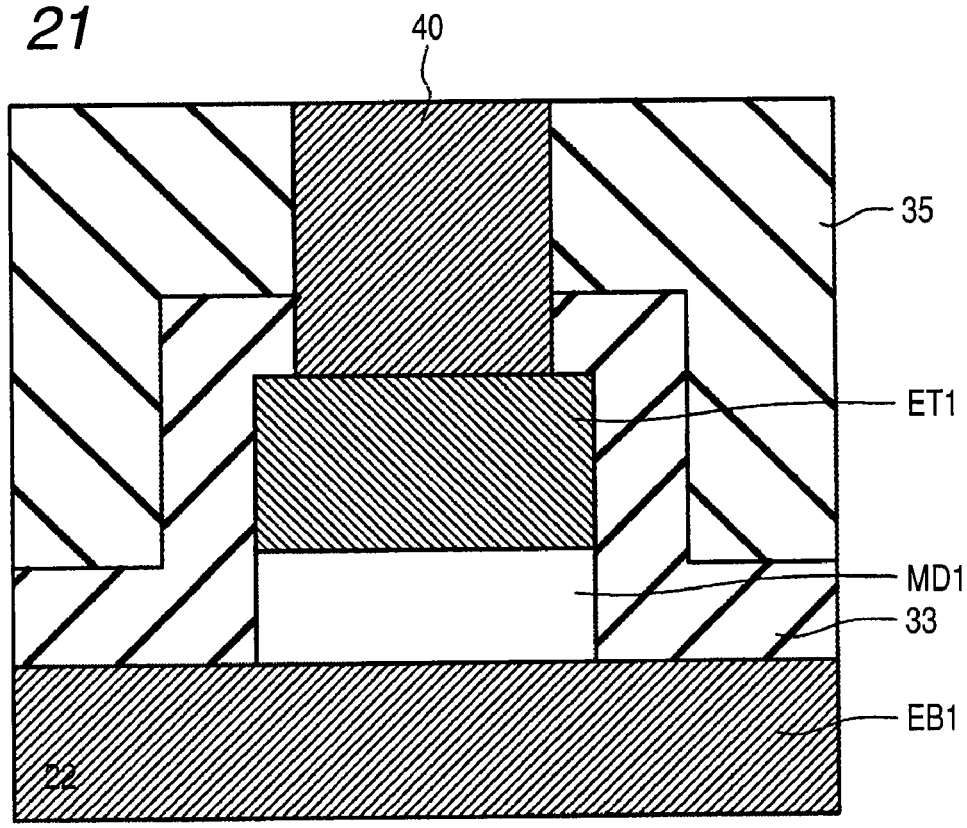
FIG. 21 is a cross-sectional view illustrating a manufacturing method of Embodiment 1.

FIG. 21 is an explanatory view illustrating an enlarged structure of a region v2 enclosed with a broken line in FIG. 20. As illustrated in this drawing, the via hole 40 penetrates through the silicon nitride film 33 and the interlayer insulating film 35 and is electrically coupled to the upper electrode ET1.

In the final step, an interlayer insulating film (not illustrated) is formed over the entire surface, whereby the MRAM of Embodiment 1 as illustrated in FIG. 1 and equipped with the memory cell portion having the lower electrode EB1, the MTJ element MD1, and the upper electrode ET1 is completed.

A method of forming the silicon nitride film as illustrated in FIG. 16 which is the characteristic of the manufacturing method of the MRAM of Embodiment 1 will hereinafter be described specifically.

As a film forming apparatus of the silicon nitride film 33, a parallel plate plasma CVD apparatus is employed. As a film forming gas, a $SiH_4/N_2$/helium (He) gas is used to satisfy the first condition, that is, a film forming gas should be free of $NH_3$. For example, $SiH_4$ can be supplied at a flow rate of from 1 to 500 (sccm), $N_2$ can be supplied at a flow rate of from 80 to 40000 (sccm), and He (helium) can be supplied at a flow rate of from 100 to 50000 (sccm).

The pressure upon film formation is set at from 1 to 20 (Torr), the electrode distance between parallel plates is set at from 5 to 15 nm, and the RF power is set at from 0.1 to 10 $W/cm^2$. The film forming temperature is set at from 200 to 350° C. to satisfy the second condition.

The upper-limit temperature not affecting the electrical and magnetic properties of the magnetic material of the MTJ element MD1 is 300° C. when the tunnel insulating film 7 forming the MTJ element MD1 is made of an aluminum oxide ($AlO_x$) such as alumina ($Al_2O_3$), while it is 350° C. when the tunnel insulating film 7 is made of magnesium oxide (MgO).

When the silicon nitride film 33 is formed in consideration of the second condition, an ideal film forming temperature when the tunnel insulating film 7 forming the MTJ element MD1 is made of $AlO_x$ is from 200 to 300° C., while an ideal film forming temperature when the tunnel insulating film 7 is made of MgO is from 200 to 350° C.

The upper-limit temperature is different between when the material forming the tunnel insulating film 7 is $AlO_x$ and that is MgO because of the following reason. As the tunnel insulating film 7 (tunnel barrier), $AlO_x$ is used in amorphous form, while MgO is used in crystal form. Annealing is therefore necessary for crystallization of MgO and a temperature of about 350° C. is necessary for the annealing. The upper-limit temperature is however set at 350° C. in consideration that excessively high annealing temperature may cause deterioration in the magnetic properties of the pin layer of the MTJ element MD1. As described above, $AlO_x$ is used in amorphous form so that annealing for crystallization is not necessary. It needs a low temperature process of about 300° C. so that the upper limit temperature is set at 300° C.

The lower limit of the film forming temperature is set at 200° C. or less because it is substantially difficult to form the silicon nitride film 33 at a film forming temperature less than 200° C. by using the parallel plate plasma CVD apparatus.

Figure 22:
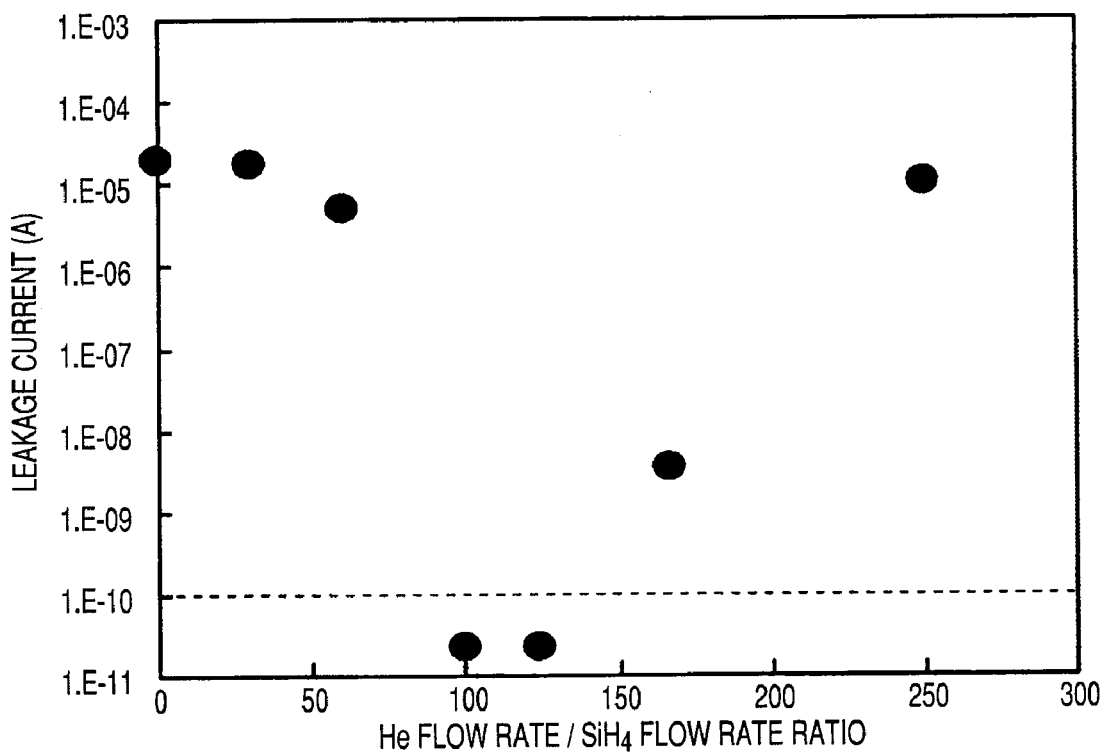
FIG. 22 is a graph showing the relationship between a helium gas:silane gas flow rate ratio and a leakage current of a silicon nitride film formed at the ratio.

FIG. 22 is a graph showing the relationship between a $He/SiH_4$ flow rate ratio and a leakage current of the silicon nitride film 33 formed at the ratio. The flow rate of $N_2$ at the time of film formation is about 80 (sccm) and film forming temperature is 275° C.

As is apparent from this graph, when the flow rate of He is from 100 to 125 times higher than that of the flow rate of $SiH_4$, the silicon nitride film 33 formed at this flow rate ratio has a leakage current below 1.E-10 ($10^{-10}$) and shows good insulation properties.

As described above, in order to satisfy the first condition, that is, $NH_3$ is not used as a film forming gas and the second condition, that is, film formation is performed at a temperature not exceeding 350° C., it is ideal to use a $SiH_4/N_2$/He gas as the film forming gas and set a SiH$_4$:N$_2$:He flow rate ratio to satisfy, for example, 1:80:100 (which will hereinafter abbreviated as "standard gas flow rate ratio").

The reason why the silicon nitride film 33 having good insulation properties is available by employing the above-described standard gas flow rate ratio is presumed to be that dilution with He supplied at a high flow rate facilitates decomposition of N$_2$. As a result, N$_2$ can contribute to the formation of the silicon nitride film 33 not only as a carrier gas but also as a reactive gas.

As is apparent from the graph of FIG. 22, it is of course possible to reduce the flow rate of SiH$_4$ or increase the flow rate of He from the standard gas flow rate ratio to allow a He/SiH$_4$ flow rate ratio to fall within a range of from 100 to 125.

Since NH$_3$ is not contained in the film forming gas, adverse effects on the MTJ element MD1 such as deterioration of magnetic properties of the magnetic films 6 and 8 which will otherwise be caused by the presence of NH$_3$ can be avoided certainly. Even if the upper magnetic film 8 which will be a free layer is made of a B-containing substance such as CoFeB, the film forming gas has no adverse effect on the upper magnetic film 8. Moreover, the film forming temperature is set so as not to adversely affect the electrical and magnetic properties of the magnetic material of the MTJ element MD1 in accordance with the second condition.

As a result, formation of the silicon nitride film 33 does not deteriorate the properties of the MTJ element MD1. For example, compared with a conventional film corresponding to the silicon nitride film 33 formed at a film forming temperature around 400° C. by using NH$_3$ as a film forming gas, the silicon nitride film 33 is expected to reduce a variation in a write switching current Isw by about 10%.

As the film forming gas, hydrogen (H$_2$) is usable instead of He. The silicon nitride film 33 having a leakage current below 1.E-10 and thus having good insulation properties can be obtained by forming it with a film forming gas having a SiH$_4$:H$_2$:N$_2$ flow rate ratio adjusted to 1:30:80.

Thus, in the manufacturing method of MRAM according to Embodiment 1, since the silicon nitride film 33 is formed without using NH$_3$ as a film forming gas, formation of the silicon nitride film 33 does not have an adverse effect on the properties of the MTJ element MD1.

Moreover, use of He or H$_2$ instead of NH$_3$ as a film forming gas in the manufacturing method of the MRAM of Embodiment 1 is effective for obtaining the silicon nitride film 33 having good insulation properties.

In addition, since the silicon nitride film 33 can be formed using a relatively inexpensive parallel plate plasma CVD apparatus, a production cost can be reduced.

Embodiment 2

Figure 23:
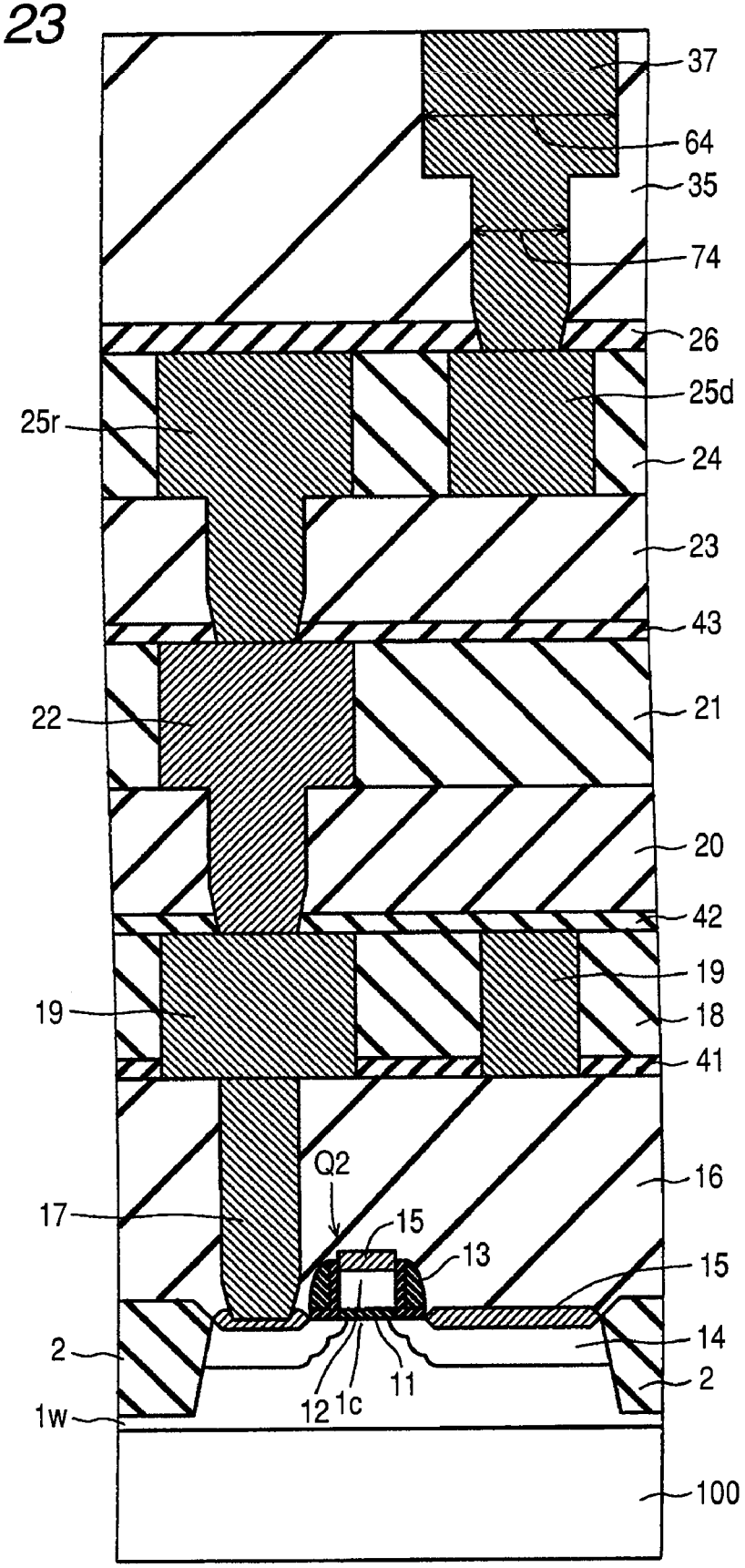
FIG. 23 is a cross-sectional view illustrating a part of a manufacturing method of a peripheral circuit portion of an MRAM of Embodiment 2 of the invention.

FIG. 23 is a cross-sectional view illustrating a part of a manufacturing method of a peripheral circuit portion (peripheral circuit formation region) of an MRAM of Embodiment 2 according to the invention.

In the peripheral circuit portion illustrated in FIG. 23, a structure extending from a semiconductor substrate 100 to a lead line 25r and a digit line 25d (Cu interconnects 25) above the semiconductor substrate is manufactured as in the memory cell portion illustrated in FIGS. 2 to 10 so that like members are identified by like reference numerals and description on them is omitted. In a third metal interconnect of the peripheral circuit portion, however, the Cu interconnects 25 function neither as a digit line nor as a lead line but function as an ordinary third metal interconnect. An MOS transistor Q2 also having a channel region 1c, a gate insulating film 11, a gate electrode 12, and a source/drain region 14 is formed in the peripheral circuit portion and it is formed in a similar manner to that of the MOS transistor Q1.

The manufacturing method of the MRAM of Embodiment 2 will next be described referring to FIG. 11 to FIG. 20 of Embodiment 1 and FIG. 23.

As illustrated in FIGS. 11 to 23, a silicon nitride film is formed as an interlayer insulating film 26 over the entire surface and a via hole 9 penetrating through a portion over a region of the lead line 25r in the memory cell portion is selectively formed in the interlayer insulating film. The via hole 9 is not formed in the peripheral circuit region.

As illustrated in FIG. 12, a barrier metal layer 28 is formed over the entire surface including the inside of the via hole 9 and a via-filling metal layer 29 is formed over the barrier metal layer 28.

As illustrated in FIG. 13, the barrier metal layer 28 and the via-filling metal layer 29 are subjected to CMP treatment to leave the barrier metal layer 28 and the via-filling metal layer 29 only in the via hole 9. During this treatment, the barrier metal layer 28 and the via-filling metal layer 29 are all removed from the peripheral circuit portion.

As illustrated in FIG. 14, a lower electrode layer 30, a film 31 for MTJ, and an upper electrode layer 32 are stacked over the entire surface. The lower electrode layer 30 and the upper electrode layer 32 are formed using, for example, Ta as a constituent material and are formed, for example, by sputtering.

As illustrated in FIG. 15, the film 31 for MTJ and the upper electrode layer 32 are patterned using a patterned resist which is not illustrated in this drawing to obtain an MTJ element MD1 and an upper electrode ET1. During patterning, the film 31 for MTJ and the upper electrode layer 32 are all removed from the peripheral circuit portion.

As illustrated in FIG. 16, a silicon nitride film 33 is formed over the entire surface including the MTJ element MD1 and the upper electrode ET1. The silicon nitride film 33 is formed so that it has a thickness almost equal to that of the interlayer insulating film 26. A resist pattern 34 is then selectively formed over the silicon nitride film by lithography.

As illustrated in FIG. 17, with the resist pattern 34 as a mask, the silicon nitride film 33 and the lower electrode layer 30 are patterned by dry etching to obtain patterned silicon nitride film 33 and a lower electrode EB1. During patterning, the silicon nitride film 33 and the lower electrode layer 30 are all removed from the peripheral circuit portion.

As illustrated in FIG. 19, an interlayer insulating film 35 made of SiO$_2$ is then formed over the entire surface.

As illustrated in FIGS. 20 and 23, the interlayer insulating film 35 is then subjected to CMP treatment to planarize the interlayer insulating film 35. Following planarization, a via hole 40 penetrating through the silicon nitride film 33 and the interlayer insulating film 35 is formed above the upper electrode ET1.

In the peripheral circuit portion, on the other hand, a minute hole 74 (second through-hole) penetrating through the interlayer insulating film 26 (insulating film for peripheral circuit) and the lower-layer portion of and the interlayer insulating film 35 is selectively formed and moreover, an interconnect hole 64 penetrating through the upper-layer portion of the interlayer insulating film 35 above a region including the minute hole 74 is selectively formed.

Upon formation of these holes, the via hole 40 in the memory cell portion and the minute hole 74 in the peripheral circuit portion are formed in one step. This enables to form the via hole 40 and the minute hole 74 with accuracy because the via hole 40 and the minute hole 74 are formed, respectively, in the silicon nitride film 33 and the interlayer insulating film 26 made of the same material (silicon nitride film) and having almost the same film thickness.

Described specifically, the via hole 40 and the minute hole 74 can be formed, respectively, with accuracy by etching the interlayer insulating film 35 with the silicon nitride film 33 and the interlayer insulating film 26 as an etching stopper and then etching the silicon nitride film 33 and the interlayer insulating film 26 having the same film thickness and made of the same material.

In the memory cell portion, as illustrated in FIG. 20, a bit line is obtained by filling a Cu interconnect 37 in the via hole 40 and forming the Cu interconnect 37 (first interconnect) over the interlayer insulating film 35. As a result, the Cu interconnect 37 is electrically coupled to the upper electrode ET1 over the MTJ element MD1 via the via hole 40.

In the peripheral circuit portion, as illustrated in FIG. 23, a Cu interconnect 37 (second interconnect) is filled in the minute hole 74 and the interconnect trench 64. As a result, the Cu interconnect 37 is electrically coupled to the Cu interconnect 25 (lower-layer interconnect) which is a third metal interconnect, via the interconnect hole 64 and the minute hole 74.

In the final step, an interlayer insulating film (not illustrated) is formed over the entire surface, whereby the MRAM of Embodiment 2 equipped with the memory cell portion having the lower electrode EB1, the MTJ element MD1, and the upper electrode ET1 is completed as illustrated in FIG. 1.

What is claimed is:

1. A manufacturing method of a semiconductor device, comprising the steps of:
   (a) forming a first conductive layer for a lower electrode over a semiconductor substrate;
   (b) selectively forming an MTJ element portion including a multilayer structure obtained by stacking, over a portion of the lower electrode, a first magnetic film, an insulating film, and a second magnetic film in the order of mention,
   wherein the second magnetic film has, as a constituent material thereof, a magnetic body containing boron; and
   (c) forming a silicon nitride film while covering therewith at least the surface and the side surface of the MTJ element portion,
   wherein the step (c) further comprises a step of forming the silicon nitride film by a CVD method under a condition of a film forming gas containing a hydrogen gas or helium gas and not containing an ammonia gas.

2. The manufacturing method of a semiconductor device according to claim 1, wherein the step (c) comprises a step performed while satisfying a temperature condition of from 200 to 350° C.

3. The manufacturing method of a semiconductor device according to claim 1, wherein the second magnetic film has, as a constituent material thereof, cobalt iron boron.

4. The manufacturing method of a semiconductor device according to claim 1, wherein the CVD method include a CVD method using a parallel plate CVD apparatus.

5. The manufacturing method of a semiconductor device according to claim 1, wherein in the step (c), the film forming gas contains helium and silane, the CVD method includes a CVD method performed while supplying helium at a first flow rate and silane at a second flow rate, and the first flow rate is set at from 100 to 125 times higher than the second flow rate.

6. The manufacturing method of a semiconductor device according to claim 1,
   wherein a region over the semiconductor substrate includes a memory cell formation region and a peripheral circuit formation region,
   wherein the first conductive layer, the MTJ element portion, and the silicon nitride film are formed in the memory cell formation region,
   wherein the manufacturing method further comprises the steps of:
   (d) forming a peripheral-circuit insulating film in the peripheral circuit formation region over the semiconductor substrate;
   (e) forming a first through-hole penetrating the silicon nitride film in the memory cell formation region and forming a second through-hole penetrating through the peripheral-circuit insulating film in the peripheral circuit formation region; and
   (f) forming a first interconnect to be electrically coupled to the upper electrode of the MTJ element portion via the first through-hole in the memory cell formation region and forming a second interconnect to be electrically coupled to a predetermined lower interconnect below the peripheral-circuit insulating film via the second through-hole in the peripheral circuit formation region, and
   wherein the silicon nitride film and the peripheral-circuit insulating film have a similar thickness.

7. The manufacturing method of a semiconductor device according to claim 2, wherein the insulating film in the multilayer structure contains magnesium oxide.

8. The manufacturing method of a semiconductor device according to claim 2, wherein the insulating film in the multilayer structure contains aluminum oxide, and
   wherein the temperature condition includes temperatures from 200 to 300° C.

* * * * *